(12) United States Patent
Gan

(10) Patent No.: US 10,790,243 B2
(45) Date of Patent: Sep. 29, 2020

(54) PROTECTION CIRCUIT AND INTEGRATED CIRCUIT

(71) Applicants: Semiconductor Manufacturing International (Shanghai) Corporation, Shanghai (CN); Semiconductor Manufacturing International (Beijing) Corporation, Beijing (CN)

(72) Inventor: Zheng Hao Gan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 474 days.

(21) Appl. No.: 15/689,161

(22) Filed: Aug. 29, 2017

(65) Prior Publication Data
US 2018/0068961 A1 Mar. 8, 2018

(30) Foreign Application Priority Data

Sep. 5, 2016 (CN) .......................... 2016 1 0803202

(51) Int. Cl.
| | | |
|---|---|---|
| *H01L 23/62* | (2006.01) | |
| *H01L 23/00* | (2006.01) | |
| *H01L 27/02* | (2006.01) | |
| H01L 25/00 | (2006.01) | |
| H02H 9/04 | (2006.01) | |
| H01L 23/48 | (2006.01) | |
| H05K 1/02 | (2006.01) | |
| H01L 23/525 | (2006.01) | |

(52) U.S. Cl.
CPC .............. *H01L 23/62* (2013.01); *H01L 24/00* (2013.01); *H01L 27/0292* (2013.01); *H01L 23/481* (2013.01); *H01L 23/5256* (2013.01); *H01L 25/50* (2013.01); *H01L 27/0248* (2013.01); *H01L 2225/06541* (2013.01); *H02H 9/046* (2013.01); *H05K 1/0259* (2013.01)

(58) Field of Classification Search
USPC ......................................................... 361/56
See application file for complete search history.

(56) References Cited

U.S. PATENT DOCUMENTS

| | | |
|---|---|---|
| 6,141,245 A | 10/2000 | Bertin et al. |
| 2005/0088794 A1 | 4/2005 | Boerstler et al. |
| 2007/0080739 A1* | 4/2007 | Taki .................... H01L 23/5256 327/525 |

(Continued)

FOREIGN PATENT DOCUMENTS

WO 0147017 A1 6/2001

OTHER PUBLICATIONS

The European Patent Office (EPO) The Extended European Search Report for 17188702.9 dated Feb. 1, 2018 7 Pages.

(Continued)

*Primary Examiner* — Danny Nguyen
(74) *Attorney, Agent, or Firm* — Anova Law Group, PLLC

(57) ABSTRACT

Protection circuit and integrated circuit are provided. A protection circuit includes a discharge passage, configured to perform an electro-static discharge and a controller configured to blow out the electric fuse after the discharge passage fulfills electro-static discharge. The discharge passage includes an electric fuse.

19 Claims, 5 Drawing Sheets

(56) References Cited

U.S. PATENT DOCUMENTS

2013/0113049 A1* 5/2013 Fang .................. H01L 27/0255
              257/379
2014/0098448 A1  4/2014 Henderson et al.

OTHER PUBLICATIONS

Duckhwan Kim and Saibal Mukhopadhyay, On the Design of Reliable 3D-ICs Considering Charged Device Model ESD Events During Die Stacking, In Proceedings of the 51st Annual Design Automation Conference, 2014, 6 pages, ACM.

* cited by examiner

PROTECTION CIRCUIT AND INTEGRATED CIRCUIT

CROSS-REFERENCES TO RELATED APPLICATIONS

This application claims the priority of Chinese patent application No. 201610803202.9, filed on Sep. 5, 2016, the entirety of which is incorporated herein by reference.

FIELD OF THE DISCLOSURE

The present disclosure generally relates to the field of circuit and, more particularly, relates to a protection circuit and an integrated circuit.

BACKGROUND

The through-silicon-via (TSV) technology is widely applied to three dimensional integrated circuits (3D-IC). When fabricating the 3D-IC circuit, the wafer (or die) including the TSVs is thinned, and the thinned wafer (or die) is bonded to another wafer (or die).

Due to mechanical friction during the process of wafer (or die) thinning, electrostatic charging occurs in the top die of the wafer (or die), and the electric charges are stored in the top die. When the thinned wafer (or die) is bonded to another wafer (or die), the charges in the top die are released to the bottom die via the TSVs, thereby generating electro-static discharge (ESD). Though the EDS process is very short that lasts approximately 50 ps, the peak voltage is, however, very high, such that the transistors connected to the TSV may be damaged.

To avoid the damage caused by ESD, often an ESD protection circuit is configured for each TSV. FIG. 1 illustrates a structural schematic view of an existing ESD protection circuit. As shown in FIG. 1, the existing ESD protection circuit includes: a resistor R, a diode D, and a bipolar junction transistor T. A first end of the resistor R is connected to a cathode of the diode D and an emitting electrode of the bipolar junction transistor T. An anode of the diode D and a collecting electrode of the bipolar junction transistor T are both connected to a low voltage line (VSS). The low voltage line VSS may be a ground line. A base electrode of the bipolar junction transistor T may be suitable for receiving a power supply voltage VDD. For example, the bipolar junction transistor T may realize the electro-static discharge of the positive electricity, and the diode may realize the electro-static discharge of the negative electricity.

The ESD protection circuit may be fabricated on the first wafer including the TSV, or fabricated on the second wafer bonded to the first wafer. After bonded to the thinned first wafer, a first end of the resistor R of the second wafer may be connected to an internal circuit of the second wafer, and a second end of the resistor R may be connected to a TSV of the first wafer. The electrostatic charges stored in the first wafer may be released to the low voltage line VSS via the ESD protection circuit, thereby preventing the internal circuit on the second wafer from being damaged. Obviously, ESD protection circuits in other structures may exist in current technologies, such as that described in the US patent application with a publication number of U.S. Pat. No. 9,019,668B2.

Though the existing ESD protection circuit solves issues caused by the electro-static discharge, the issue of propagation delay is however introduced.

The disclosed protection circuit and integrated circuit are directed to at least partially solving one or more problems set forth above and other problems.

BRIEF SUMMARY OF THE DISCLOSURE

One aspect of the present disclosure provides a protection circuit. The protection circuit includes a discharge passage, configured to perform an electro-static discharge and a controller configured to blow out the electric fuse after the discharge passage fulfills electro-static discharge. The discharge passage includes an electric fuse.

Another aspect of the present disclosure provides an integrated circuit. The integrated circuit includes a first wafer including a through-silicon via and a protection circuit including a discharge passage and a controller. The discharge passage includes an electric fuse and is configured to perform electro-static discharge. The controller is configured to blow out the electric fuse after the discharge passage fulfills electro-static discharge. The discharge circuit included in the protection circuit is connected to the through-silicon via.

Other aspects of the present disclosure can be understood by those skilled in the art in light of the description, the claims, and the drawings of the present disclosure.

DETAILED DESCRIPTION

Through studies, the inventors of the present disclosure found that the intrinsic stray capacitance and stray resistance of the ESD protection circuit cause signal propagation delay, especially when the number of TSVs is much larger than the number of the input and output (I/O) pins. Study showed that the propagation delay may increase by 44% for the smallest ESD protection circuit and increase by 68% for the largest ESD protection circuit.

Based on the aforementioned research conclusions, the present disclosure provides an improved protection circuit, including a discharge passage and a controller. The discharge passage may be configured to perform electro-static discharge and may include an electric fuse (eFuse). The controller may be configured to blow out the electric fuse after the discharge passage fulfills electro-static discharge.

In the disclosed technical solutions, before the electric fuse is blown out, the discharge passage may perform normal electro-static discharge to protect the wafer (or the die). After the electro-static discharge is fulfilled, the controller may blow out the electric fuse, such that the discharge passage may cut off the connection relationship with the wafer (or die), thereby preventing the introduction of the stray capacitance and the stray resistance. Accordingly, the propagation delay of the signal may be overcome.

To make the aforementioned object, features, and advantages of the present disclosure more apparent and easier to understand, specific embodiments of the present disclosure will be illustrated in detail hereinafter with reference to the accompanying drawings.

Figure 1:
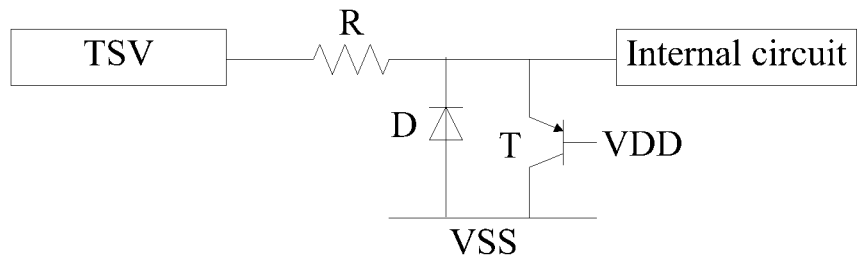
FIG. 1 illustrates a structural schematic view of an existing ESD protection circuit.
Figure 2:
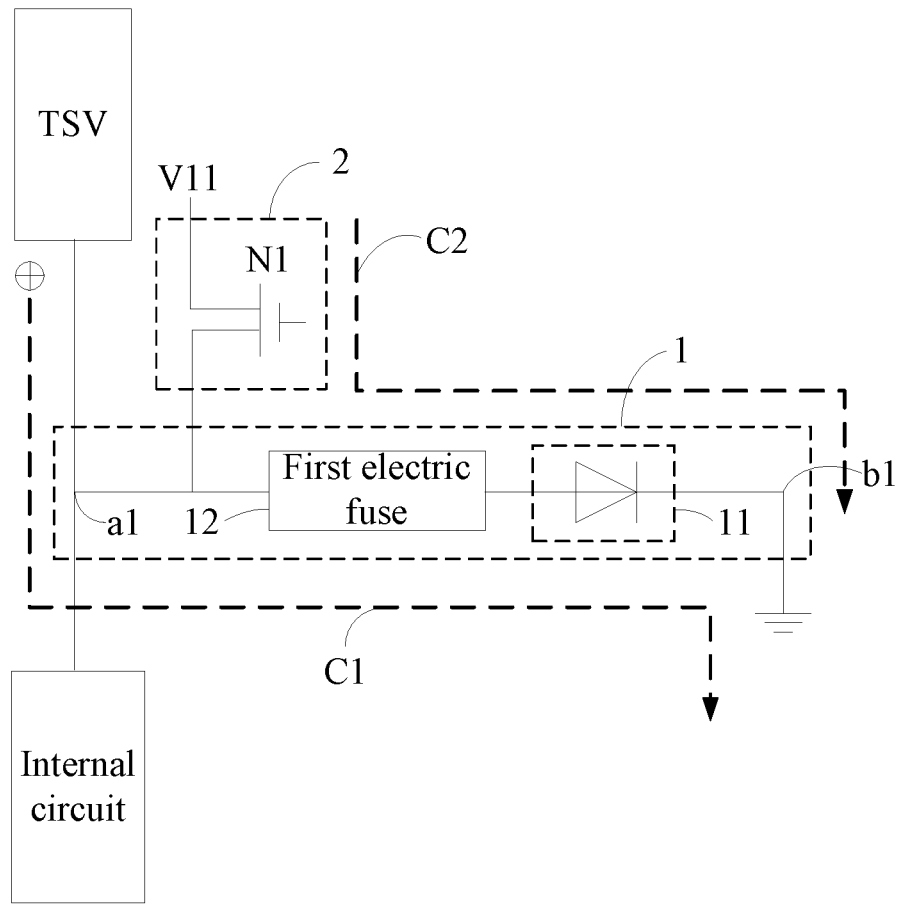
FIGS. 2-6 illustrate structural schematic views of various protection circuits consistent with the disclosed embodiments.

FIGS. 2-6 illustrate structural schematic views of various protection circuits consistent with the disclosed embodiments. As shown in FIG. 2, the present disclosure provides a protection circuit, including a first discharge passage 1 and a controller 2.

The first discharge passage 1 may be configured to perform electro-static discharge of positive electricity. The first discharge passage 1 may include a positive electro-static discharge (ESD) circuit 11 (which is also referred to as an electro-static discharge circuit for positive charges) and a first electric fuse 12. The positive ESD circuit 11 and the first electric fuse 12 may be connected in series between an input end a1 and an output end b1 of the first discharge passage 1.

For example, a first end of the first electric fuse 12 may be connected to the input end a1 of the first discharge passage 1, and a second end of the first electric fuse 12 may be connected to an anode of the positive ESD circuit 11. Further, a cathode of the positive ESD circuit 11 may be connected to the output end b1 of the first discharge passage 1.

The positive ESD circuit 11 may be configured to perform electro-static discharge of the positive charges. The positive ESD circuit 11 may include a diode, a bipolar junction transistor (BJT), a silicon-controlled rectifier (SCR), or a gate-grounded NMOS (GGNMOS) tube or transistor, etc. The present disclosure uses the diode as an example to illustrate the positive ESD circuit, and those skilled in the relevant art may obtain other implementation methods of the electro-static discharge circuit based on the disclosed embodiments, which is not repeatedly described herein.

The input end a1 of the first discharge passage 1 may be configured to connect the TSV in the first wafer with the internal circuit in the second wafer. The first wafer is a wafer thinned by mechanical friction, and the second wafer is a wafer bonded to the first wafer. The output end b1 of the first discharge passage 1 may be connected to ground. The disclosed protection circuit may be fabricated on the first wafer, or fabricated on the second wafer.

The controller 2 may include a first switch. A first end of the first switch may be connected to the input end a1 of the first discharge passage 1 and a first end of the first electric fuse 12. A second end of the first electric fuse 12 is connected to a positive electrode of the diode in the positive ESD circuit 11. A negative electrode of the diode in the positive ESD circuit 11 may be connected to the output end b1 of the first discharge passage.

The first switch may be configured to be in a connected status after the first discharge passage 1 fulfills electro-static discharge, and the first switch may be configured in a disconnected status before the first discharge passage 1 fulfills the electro-static discharge. While the first end of the first switch may be connected to the first discharge passage 1, a second end of the first switch may be configured to receive a first voltage level V11, where the first voltage level V11 may be related to a blow-out voltage of the first electric fuse 12. More specifically, when the first voltage level V11 is supplied to the first discharge passage 1 via the first switch, the voltage at the first electric fuse 12 may need to be greater than or equal to the blow-out voltage of the first electric fuse 12. The voltage level of the first voltage V11 may be approximately 1V~4V.

Before the electro-static discharge is fulfilled, the following stages may be included: before the first wafer and the second wafer are bonded, when the first wafer and the second wafer are bonded, and during the process where the first discharge passage 1 performs electro-static discharge after the first wafer and the second wafer are bonded. That is, before the first wafer and the second wafer are bonded, when the first wafer and the second wafer are bonded, and during a process where the first discharge passage performs electro-static discharge after the first wafer and the second wafer are bonded, the first switch remains in a disconnected status. Those skilled in the relevant art may, according to actual situations, pre-estimate the duration of the electro-static discharge, thereby determining the time when the first switch switches the status.

The first switch may be implemented by a first NMOS transistor N1. A drain electrode of the first NMOS transistor N1 may be used as a first end of the first switch and be configured to be connected and receive the first voltage V11. A source electrode of the first NMOS transistor N1 may be used as a second end of the first switch and be configured to be connected to the input end a1 of the first discharge passage and the first end of the first electric fuse 12. The first NMOS transistor N1 may be in an "ON" status after the first discharge passage 1 fulfills electro-static discharge and in an "OFF" status before the first discharge passage 1 fulfills electro-static discharge. The switch between the "ON" status and the "OFF" status may be implemented by changing the voltage at the gate electrode of the first NMOS transistor N1.

During the thinning process of the first wafer, the positive charges may be stored in the top die. After the first wafer is bonded to the second wafer, the positive charges in the top die may flow into the input end a1 of the first discharge passage via the TSV and may further be released to the ground via a first path C1. During the electro-static discharge process of the positive charges, the first NMOS transistor N1 may be in the "OFF" status. That is, the positive charges may be released to the ground after sequentially passing through the input end a1 of the first discharge passage 1, the first electric fuse 12, the positive ESD circuit 11, and the output end b1 of the first discharge passage 1.

After the first discharge passage 1 fulfills electro-static discharge of the positive charges, the gate electrode voltage of the first NMOS transistor N1 may be controlled to switch the "OFF" status of the first NMOS transistor N1 to the "ON" status. The first voltage V11 may apply a corresponding voltage to the first electric fuse 12 via a second path C2, and blow out the first electric fuse 12.

From the aforementioned working process, it may be found that before the first electric fuse 12 is blew out, the first discharge passage 1 may perform normal electro-static discharge of positive electricity, thereby preventing the electro-static charges of positive electricity from damaging the internal circuit of the second wafer. After the electro-static discharges is fulfilled, the controller 2 may introduce the first voltage V11 to blow out the first electric fuse 12, such that the first discharge passage 1 may cut off the connection relationship between the first wafer and the second wafer, thereby avoiding the introduction of stray capacitance and stray resistance. Accordingly, the signal propagation delay may be overcome.

Figure 3:
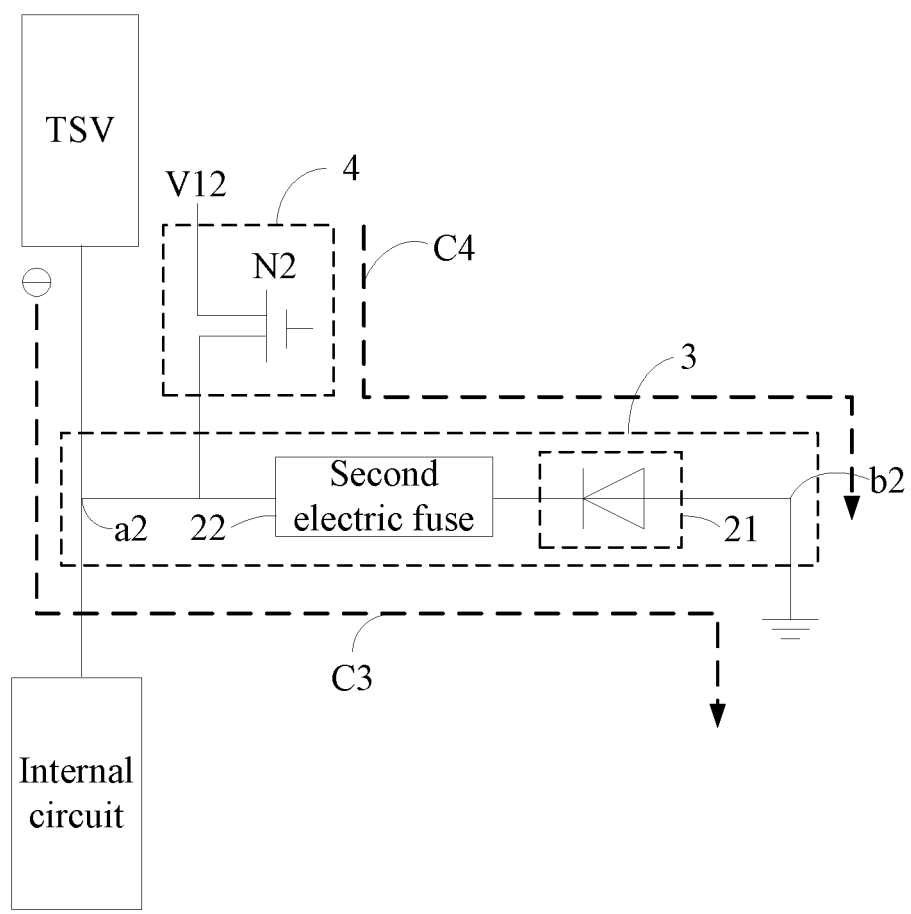

FIG. 3 illustrates another exemplary protection circuit. As shown in FIG. 3, the protection circuit may include a second discharge passage 3 and a controller 4. The second discharge passage 3 may be configured to perform electro-static discharge of negative electricity. The second discharge passage 3 may include an electro-static discharge circuit of negative electricity 21 and a second electric fuse 22. The electro-static discharge circuit of negative electricity 21 and the second electric fuse 22 may be connected in series between an input end a2 and an output end b2 of the second discharge passage 3.

The electro-static discharge circuit of negative electricity 21 may be configured to perform electro-static discharge of negative charges. The electro-static discharge circuit of negative electricity 21 may include a diode, a bipolar junction transistor, a silicon-controlled rectifier (SCR), or a gate-grounded NMOS transistor. The present disclosure uses the diode as an example to illustrate the electro-static discharge circuit of negative electricity 21, and those skilled in the relevant art may obtain other implementation methods of the electro-static discharge circuit based on the disclosed embodiments, which is not repeatedly described herein.

The input end a2 of the second discharge passage 3 may be configured to connect the TSV in the first wafer to the internal circuit in the second wafer. The first wafer may be a wafer thinned by mechanical friction, and the second wafer may be a wafer bonded to the first wafer. The output end b2 of the second discharge passage 3 may be connected to the ground. The disclosed protection circuit may be fabricated in the first wafer, or may be fabricated in the second wafer.

The controller 4 may include a first switch. A first end of the first switch may be connected to the input end a2 of the second discharge passage 3 and a first end of the second electric fuse 22. A second end of the second electric fuse 22 may be connected to a cathode of the diode in the electro-static discharge circuit of negative electricity 21. An anode of the diode in the electro-static discharge circuit of negative electricity 21 may be connected to the output end b2 of the second discharge passage 3.

The first switch may be in an "ON" status after the second discharge circuit 3 fulfills electro-static discharge and in an "OFF" status before the second discharge circuit 3 fulfills electro-static discharge. The first end of the first switch may be connected to the second discharge passage 3, and the second end of the first switch may be configured to receive the first voltage V12. The first voltage V12 may be related to the blow-out voltage of the second electric fuse 22. More specifically, when the first voltage V12 is introduced to the second discharge passage 3 via the first switch, the voltage at the second electric fuse 22 may be greater than or equal to the fusing voltage of the second electric fuse 22. The voltage level of the first voltage level V12 may be approximately 1V~4V.

Before the electro-static discharge is fulfilled, the following stages may be included: before the first wafer and the second wafer are bonded, when the first wafer and the second wafer are bonded, and during a process where the second discharge passage 3 performs electro-static discharge after the first wafer and the second wafer are bonded. That is, before the first wafer and the second wafer are bonded, when the first wafer and the second wafer are bonded, and during a process where the first discharge passage performs electro-static discharge after the first wafer and the second wafer are bonded, the first switch may remain in a disconnected status. Those skilled in the relevant art may, according to actual situations, pre-estimate the lasting time of the electro-static discharge, thereby determining the timeline when the first switch switches status.

The first switch may be implemented via a first NMOS transistor N2. A drain electrode of the first NMOS transistor N2 may be used as a first end of the first switch and be configured to be connected and receive a first voltage V12. A source electrode of the first NMOS transistor N2 may be used as a second end of the first switch and be configured to be connected to the input end a2 of the second discharge passage 3 and a first end of the second electric fuse 22. The first NMOS transistor N2 may be in an "ON" status after the second discharge passage 3 fulfills electro-static discharge and in an "OFF" status before the second discharge passage 3 fulfills electro-static discharge. The switch between the "ON" status and the "OFF" status may be implemented by changing the voltage at the gate electrode of the first NMOS transistor N2.

Similar to the aforementioned embodiments, after the first wafer and the second wafer are bonded, the electrostatic charges of the negative charges may flow into the input end a2 of the second discharge passage 3 via the TSV, and be further released to the ground via a third path C3. After the second discharge passage 3 fulfills electro-static discharge of the negative charges, the controller 4 may introduce the first voltage V12 and apply a corresponding voltage to the second electric fuse 22 via a fourth path C4. The controller 4 may further blow out the second electric fuse 22.

Figure 4:
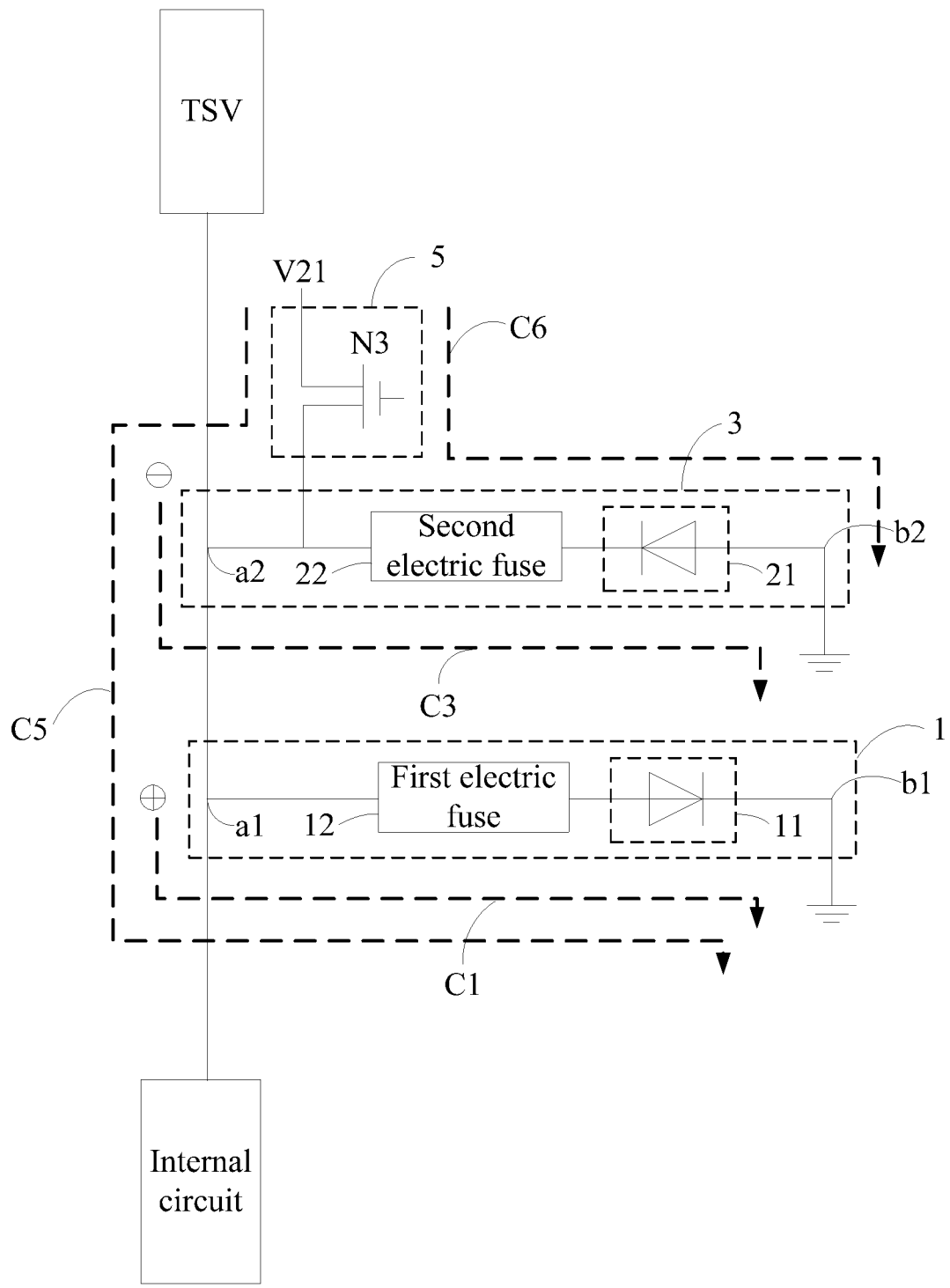

In practical production process, the electrostatic charges generated by friction and thinning of the first wafer may be positive charges or negative charges. Taken into consideration such situation, FIG. 4 illustrates another exemplary protection circuit. As shown in FIG. 4, the protection circuit may include a first discharge passage 1, a second discharge passage 3, and a controller 5.

An input end a1 of the first discharge passage 1 may be connected to an input end a2 of the second discharge passage 3, and may be connected to the TSV in the first wafer and the internal circuit in the second wafer. Descriptions of the first discharge passage 1, the second discharge passage 3, the first wafer, and the second wafer may refer to the aforementioned embodiments. Portions similar to or the same as that in the aforementioned embodiments are not repeatedly described herein, and portions different from the aforementioned embodiments are illustrated in detail hereinafter.

The disclosed controller 5 may include a second switch. The second switch may be in an "ON" status after the first discharge passage 1 fulfills the electro-static discharge of the positive electricity and the second discharge passage 3 fulfills electro-static discharge of the negative electricity. Further, the second switch may be in an "OFF" status before the first discharge passage 1 and the second discharge passage 3 both fulfill the electro-static discharge.

The first end of the second switch may be connected to the input end a1 of the first discharge passage 1, the input end a2 of the second discharge passage 3, and a first end of the second electric fuse 22. A second input end of the second switch may be configured to receive a second voltage V21. The second voltage V21 may be related to the blow-out voltages of the first electric fuse 12 and the second electric fuse 22. More specifically, when the second voltage V21 is introduced to the first discharge passage 1 and the second discharge passage 3 via the second switch, the voltage at the first electric fuse 12 may need to be greater than or equal to the blow-out voltage of the first electric fuse 12, and the voltage at the second electric fuse 22 may need to be greater than or equal to the blow-out voltage of the second electric fuse 22. The voltage level of the second voltage V21 may be approximately 1V~4V.

The second switch may be implemented via a second NMOS transistor N3. A drain electrode of the second NMOS transistor N3 may be used as the first end of the second switch and be configured to be connected and to receive the second voltage V21. A source electrode of the second NMOS transistor N3 may be used as a second end of the second switch and be configured to be connected to the input end a1 of the first discharge passage 1, the input end a2 of the second discharge passage 3, and the first end of the second electric fuse 22. The second NMOS transistor N3 may be in an "ON" status after the first discharge passage 1 and the second discharge passage 3 both fulfill electro-static discharge and in an "OFF" status before the first discharge passage 1 and the second discharge passage 3 both fulfill electro-static discharge. The switch between the "ON" status and the "OFF" status may be implemented by changing the voltage at the gate electrode of the second NMOS transistor N3.

After the first wafer and the second wafer are bonded, the positive charges and the negative charges generated by friction and thinning of the first wafer may flow into the first discharge passage 1 and the second discharge passage 3 via the input end a1 of the first discharge passage 1 and the input end a2 of the second discharge passage 3. The generated positive and negative charges may be further released to the ground via the first path C1 and the third path C3, respectively, thereby fulfilling the electro-static discharge.

After the first discharge passage 1 and the second discharge passage 3 both fulfill electro-static discharge, the second NMOS transistor N3 may be switched from the "OFF" status to the "ON" status by controlling the gate electrode voltage of the second NMOS transistor N3. The second voltage V21 may be applied to the first electric fuse 12 and the second electric fuse 22 via a fifth path C5 and a sixth path C6, respectively, and the first electric fuse 12 and the second electric fuse 22 may be blew out.

From the aforementioned working process, before the first electric fuse 12 and the second electric fuse 22 are blew out, the first discharge passage 1 and the second discharge passage 3 may both perform normal electro-static discharge, thereby preventing the positive charges and the negative charges from damaging the internal circuit of the second wafer. After the electro-static discharge is fulfilled, the controller 5 may introduce the second voltage V21 to blow out the first electric fuse 12 and the second electric fuse 22, such that the first discharge passage 1 and the second discharge passage 3 both cut off the connection relationships with the first wafer and the second wafer, thereby avoiding the introduction of stray capacitance and stray resistance. Accordingly, the signal propagation delay may be overcome.

Figure 5:
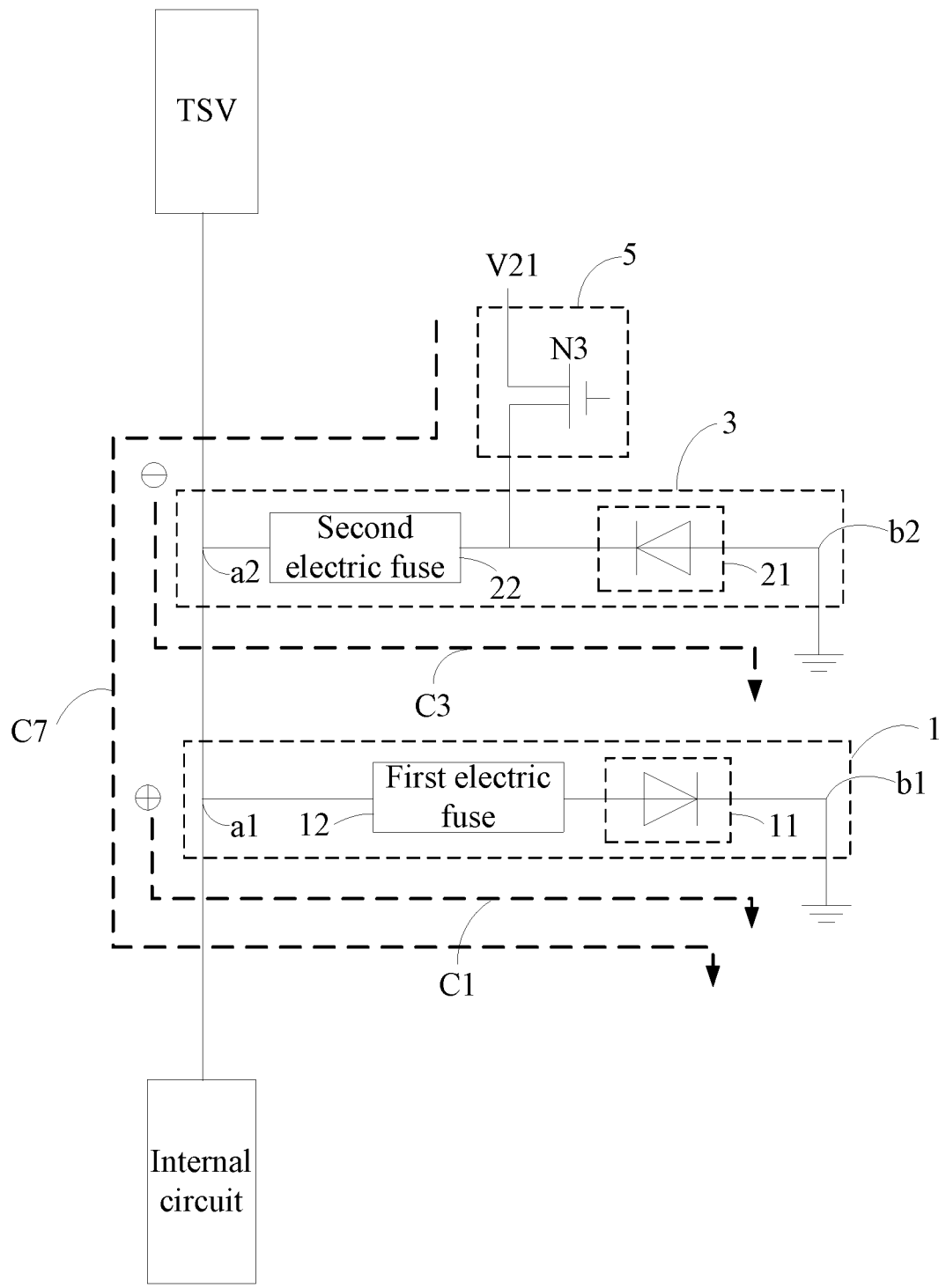

The disclosed controller 5 may be connected between the input end a2 of the second discharge passage 3 and the second electric fuse 22. Optionally, the controller 5 may be connected between the second electric fuse 22 and the electro-static discharge circuit of negative electricity 21. FIG. 5 illustrates an exemplary protection circuit where a controller is connected between a second electric fuse and an electro-static discharge circuit of negative electricity.

As shown in FIG. 5, a first end of the second electric fuse 22 may be connected to an input end a2 of the second discharge passage 3, and a second end of the second electric fuse 22 may be connected to a source electrode of the second NMOS transistor N3 and a cathode of the diode in the electro-static discharge circuit of negative electricity 21.

During electro-static discharge, the positive and the negative charges may still be released to the ground via the first path C1 and the third path C3. After electro-static discharge is fulfilled, the second NMOS transistor N3 may be switched from the "OFF" status to the "ON" status. The second voltage V21 may be applied to the first electric fuse 12 and the second electric fuse 22 via a seventh path C7, and the first electric fuse 12 and the second electric fuse 22 may be blew out.

Accordingly, as long as the controller 5 forms a conducted path with the first discharge passage 1 and the second discharge passage 3, and the second voltage V21 is applied to the first electric fuse 12 and the second electric fuse 22, the connection position of the controller 5 may be configured based on actual situations.

However, when the controller 5 is connected to an output end b1 of the first discharge passage 1 or an output end b2 of the second discharge passage 3, the second voltage V21 may be connected to the ground, and the voltage may not be applied to the first electric fuse 12 and the second electric fuse 22. Accordingly, when the second voltage V21 needs to be introduced, the connection relationship between the second voltage V21 and the ground may be cut off.

Figure 6:
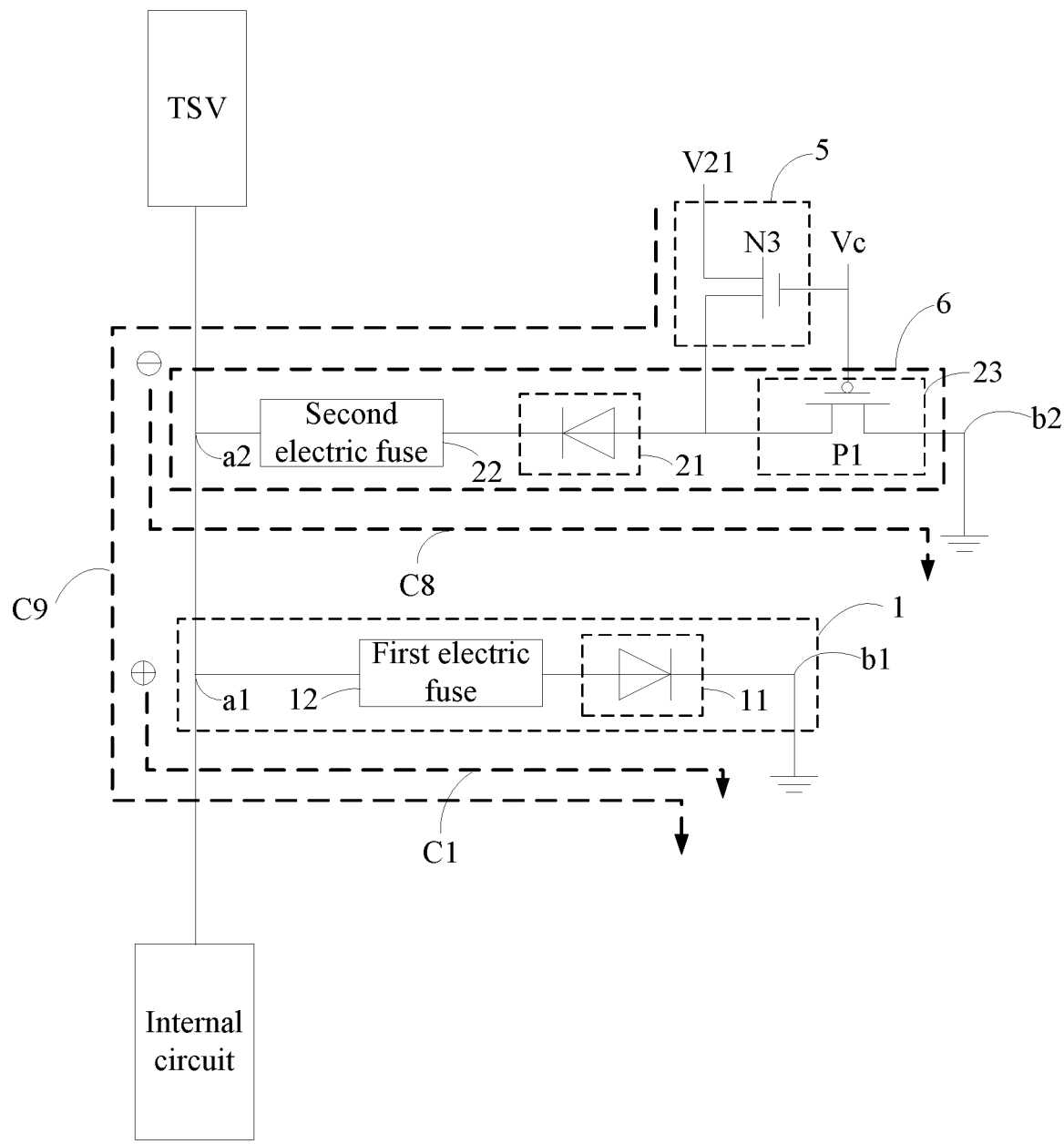

Accordingly, FIG. 6 illustrates another exemplary protection circuit. As shown in FIG. 6, a protection circuit may include a first discharge passage 1, a second discharge passage 6, and a controller 5.

Descriptions of the first discharge passage 1, the controller 5, the first wafer and the second wafer may refer to the aforementioned embodiments. Portions similar to the aforementioned embodiments may not be repeatedly described herein, and portions different from the aforementioned embodiments are illustrated in detail hereinafter. Different from the aforementioned second discharge passage 3, the second discharge passage 6 may further include a third switch 23.

The electro-static discharge circuit of negative electricity 21 may be connected to an output end b2 of the second discharge passage 6 via the third switch 23. The second switch may be connected to the second discharge passage 6 where the third switch 23 is disposed. For example, a first end of the third switch 23 may be connected to a source electrode of the second NMOS transistor N3 and an anode of the diode in the electro-static discharge circuit of negative electricity 21. A second end of the third switch 23 may be connected to an output end b2 of the second discharge passage 3. The third switch 23 may be in the "OFF" status when the second switch is in the "ON" status, and the third switch 23 may be in the "ON" status when the second switch is in the "OFF" status.

The third switch 23 may be implemented via a first PMOS transistor P1. A source electrode of the first PMOS transistor P2 may be used as a first end of the third switch 23 and be configured to be connected to the source electrode of the second NMOS transistor N3 and an anode of the diode in the electro-static discharge circuit of negative electricity 21. A drain electrode of the first PMOS transistor P1 may be used as a second end of the third switch 23 and be configured to be connected to an output end b2 of the second discharge passage 6. When the second NMOS transistor N3 is in the "OFF" status, the first PMOS transistor P1 may be in the "ON" status. When the second NMOS transistor N3 is in the "ON" status, the first PMOS transistor P1 may be in the "OFF" status. The switch between the "ON" status and the "OFF" status may be implemented via the voltage variance in the voltage of the gate electrode of the first PMOS transistor P1.

Take into consideration the damage of negative charges on the first PMOS transistor P1, the first PMOS transistor P1 may be a device with a relatively large trench width. For example, the trench width of the first PMOS transistor P1 may be approximately 200 µm~600 µm.

When the second switch and the third switch 23 are an NMOS transistor and a PMOS transistor, respectively, the gate electrodes of the PMOS transistor and the NMOS transistor may be connected and under control of a voltage. For example, in one embodiment, the gate electrode of the second NMOS transistor N3 may be connected to the gate electrode of the first PMOS transistor, and the gate electrodes of the second NMOS transistor N3 and the first PMOS transistor may be configured to receive a control voltage Vc.

When the control voltage Vc has a low voltage level, the second NMOS transistor N3 may be in the "OFF" status and the first PMOS transistor P1 may be in the "ON" status. The negative charges may be released to the ground via an eighth path C8. More specifically, the negative charges may be released to the ground via the input end a2 of the second discharge passage 6, the second electric fuse 22, the electro-static discharge circuit of negative electricity 21, the first PMOS transistor P1, and the output end b2 of the second discharge passage 6.

When the control voltage Vc has a high voltage level, the second NMOS transistor N3 may be in the "ON" status and the first PMOS transistor P1 may be in the "OFF" status. The second voltage V21 may apply a corresponding voltage to the first electric fuse 12 and the second electric fuse 22 via a ninth path C9, such that the first electric fuse 12 and the second electric fuse 22 may be blew out.

In one embodiment, the third switch 23 may be disposed in the second discharge passage 6, and in other embodiments, the third switch 23 may be disposed in the first discharge passage 1. When the third switch 23 is disposed in the first discharge passage 1, the first end of the second switch may be connected to the first discharge passage 1.

The disclosed second switch and third switch 23 may be implemented via the MOS transistors. Optionally, in practical application, the second switch and the third switch 23 may be implemented via a three-terminal switch or other circuits.

Though the present disclosure is disclosed above, the present disclosure is not limited thereto. Any equivalent or modification thereof, without departing from the spirit and principle of the present disclosure, falls within the true scope of the present disclosure, and the scope of the present disclosure is defined by the appended claims.

What is claimed is:

1. A protection circuit, comprising:
   a discharge passage configured to perform an electro-static discharge, wherein the discharge passage comprises an electric fuse; and
   a controller, configured to blow out the electric fuse after the discharge passage fulfils electro-static discharge, wherein:
   the controller includes a first switch;
   a first end of the first switch is connected to the discharge passage, a second end of the first switch is configured to receive a first voltage, and the first voltage is related to a blow-out voltage of the electric fuse; and
   the first switch is configured to be in an "ON" status after the discharge passage fulfils electro-static discharge and in an "OFF" status before the discharge passage fulfils electro-static discharge.

2. The protection circuit according to claim 1, wherein:
   the discharge passage further includes an electro-static discharge circuit; and
   the electric fuse and the electro-static discharge circuit are connected in series between an input end and an output end of the discharge passage.

3. The protection circuit according to claim 2, wherein:
   the electro-static discharge circuit further includes a diode, a bipolar junction transistor, a silicon-controlled rectifier, or a gate-grounded NMOS transistor.

4. The protection circuit according to claim 1, wherein:
   the first switch includes a first NMOS transistor;
   a drain electrode of the first NMOS transistor is configured to receive the first voltage, and a source electrode of the first NMOS transistor is connected to the discharge passage; and
   the first NMOS transistor is configured to be in the "ON" status after the discharge passage fulfils electro-static discharge and in the "OFF" status before the discharge passage fulfils the electro-static discharge.

5. A protection circuit, comprising:
   a discharge passage configured to perform an electro-static discharge, wherein the discharge passage comprises an electric fuse; and
   a controller, configured to blow out the electric fuse after the discharge passage fulfils electro-static discharge, wherein:
   the discharge passage includes a first discharge passage and a second discharge passage, and at least one of the first discharge passage and the second discharge passage includes an electric fuse;
   the first discharge passage is configured to perform electro-static discharge of positive electricity;
   the second discharge passage is configured to perform electro-static discharge of negative electricity; and
   the first discharge circuit is connected to the second discharge circuit.

6. The protection circuit according to claim 5, wherein:
   the first discharge passage further includes a positive ESD circuit, and a first electric fuse;
   the second discharge passage further includes an electro-static discharge circuit of negative electricity, and a second electric fuse;
   the first electric fuse and the positive ESD circuit are connected in series between an input end and an output end of the first discharge passage;
   the second electric fuse and the electro-static discharge circuit of negative electricity are connected in series between an input end and an output end of the second discharge passage; and
   the input end of the first discharge passage is connected to the input end of the second discharge passage.

7. The protection circuit according to claim 6, wherein:
   the positive ESD circuit includes a diode, a bipolar junction transistor, a silicon-controlled rectifier, or a gate-grounded NMOS transistor; and
   the electro-static discharge circuit of negative electricity includes a diode, a bipolar junction transistor, a silicon-controlled rectifier, or a gate-grounded NMOS transistor.

8. The protection circuit according to claim 5, wherein:
   the controller further comprises a second switch;
   a first end of the second switch is connected to the first discharge passage or the second discharge passage, a second end of the second switch is configured to receive a second voltage, and the second voltage is related to blow-out voltages of the first electric fuse and the second electric fuse; and
   the second switch is configured to be in an "ON" status after the first discharge passage and the second discharge passage both fulfill electro-static discharge and is configured to be in an "OFF" status before the first discharge passage and the second discharge passage fulfill electro-static discharge.

9. The protection circuit according to claim 8, wherein:
   the second switch comprises a second NMOS transistor;
   a drain electrode of the second NMOS transistor is configured to receive the second voltage, and a source electrode of the second NMOS transistor is connected to the first discharge passage or the second discharge passage; and the second NMOS transistor is configured to be in an "ON" status after the first discharge passage and the second discharge passage fulfill electro-static discharge and in an "OFF" status before the first discharge passage and the second discharge passage fulfill electro-static discharge.

10. The protection circuit according to claim 8, wherein:
one of the first discharge passage and the second discharge passage further includes a third switch, and the second switch is connected to a discharge passage where the third switch is included in; and
the third switch is configured to be in an "OFF" status when the second switch is in the "ON" status, and in an "ON" status when the second switch is in the "OFF" status.

11. The protection circuit according to claim 10, wherein:
the first discharge passage further includes a positive ESD circuit;
the second discharge passage further includes an electro-static discharge circuit of negative electricity;
when the first discharge passage comprises the third switch, the positive ESD circuit is connected to an output end of the first discharge passage via the third switch, wherein a first end of the third switch is connected to the second switch, and a second end of the third switch is connected to the output end of the first discharge passage; and
when the second discharge passage comprises the thirds switch, the electro-static discharge circuit of negative electricity is connected to an output end of the second discharge passage via the third switch, wherein the first end of the third switch is connected to the second switch, and the second end of the third switch is connected to the output end of the second discharge passage.

12. The protection circuit according to claim 10, wherein:
the second switch comprises a second NMOS transistor, and the third switch comprises a first PMOS transistor;
the second NMOS transistor is configured in an "ON" status after the first discharge passage and the second discharge passage fulfill electro-static discharge and in an "OFF" status before the first discharge passage and the second discharge passage fulfill the electro-static discharge; and
the first PMOS transistor is configured to be in an "OFF" status when the second NMOS transistor is in the "ON" status, and the first PMOS transistor is configured to be in an "ON" status when the second NMOS transistor is in the "OFF" status.

13. An integrated circuit, comprising:
a first wafer including a through-silicon via; and
a protection circuit including a discharge passage and a controller, wherein:
the discharge passage comprises an electric fuse and is configured to perform electro-static discharge,
the controller is configured to blow out the electric fuse after the discharge passage fulfils electro-static discharge, and
the discharge circuit included in the protection circuit is connected to the through-silicon via, wherein:
the controller includes a first switch;
a first end of the first switch is connected to the discharge passage, a second end of the first switch is configured to receive a first voltage, and the first voltage is related to a blow-out voltage of the electric fuse; and
the first switch is configured to be in an "ON" status after the discharge passage fulfils electro-static discharge and in an "OFF" status before the discharge passage fulfils electro-static discharge.

14. The integrated circuit according to claim 13, further comprising:
a second wafer including an internal circuit,
wherein the first wafer and the second wafer are bonded together, and
the discharge passage of the protection circuit is further connected to the internal circuit of the second wafer.

15. The integrated circuit according to claim 14, wherein:
the protection circuit is fabricated on the first wafer or the second wafer.

16. The protection circuit according to claim 5, wherein:
the discharge passage further includes an electro-static discharge circuit; and
the electric fuse and the electro-static discharge circuit are connected in series between an input end and an output end of the discharge passage.

17. The protection circuit according to claim 16, wherein:
the electro-static discharge circuit further includes a diode, a bipolar junction transistor, a silicon-controlled rectifier, or a gate-grounded NMOS transistor.

18. The protection circuit according to claim 5, wherein:
the controller includes a first switch;
a first end of the first switch is connected to the discharge passage, a second end of the first switch is configured to receive a first voltage, and the first voltage is related to a blow-out voltage of the electric fuse; and
the first switch is configured to be in an "ON" status after the discharge passage fulfils electro-static discharge and in an "OFF" status before the discharge passage fulfils electro-static discharge.

19. The protection circuit according to claim 18, wherein:
the first switch includes a first NMOS transistor;
a drain electrode of the first NMOS transistor is configured to receive the first voltage, and a source electrode of the first NMOS transistor is connected to the discharge passage; and
the first NMOS transistor is configured to be in the "ON" status after the discharge passage fulfils electro-static discharge and in the "OFF" status before the discharge passage fulfils the electro-static discharge.

* * * * *